US012696506B2

(12) United States Patent     (10) Patent No.:    US 12,696,506 B2
Uehigashi                          (45) Date of Patent:        Jul. 28, 2026

(54) SILICON CARBIDE WAFER AND SILICON CARBIDE SEMICONDUCTOR DEVICE INCLUDING THE SAME

(71) Applicants: DENSO CORPORATION, Kariya-city (JP); TOYOTA JIDOSHA KABUSHIKI KAISHA, Toyota (JP); MIRISE Technologies Corporation, Nisshin (JP)

(72) Inventor: Hideyuki Uehigashi, Nisshin (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 420 days.

(21) Appl. No.: 18/471,463

(22) Filed: Sep. 21, 2023

(65)          Prior Publication Data

US 2024/0136409 A1      Apr. 25, 2024
US 2024/0234515 A9      Jul. 11, 2024

(30)          Foreign Application Priority Data

Oct. 20, 2022      (JP) ................................. 2022-168533

(51) Int. Cl.
*H10D 62/60*          (2025.01)
*C30B 29/36*          (2006.01)
*H10D 8/60*           (2025.01)
*H10D 30/66*          (2025.01)
*H10D 62/832*         (2025.01)
*C30B 25/20*          (2006.01)

(52) U.S. Cl.
CPC ............. *H10D 62/60* (2025.01); *C30B 29/36* (2013.01); *H10D 8/60* (2025.01); *H10D 30/668* (2025.01); *H10D 62/8325* (2025.01); *C30B 25/20* (2013.01)

(58) Field of Classification Search
None
See application file for complete search history.

(56)          References Cited

U.S. PATENT DOCUMENTS

2018/0254324 A1      9/2018    Kaji et al.
2019/0237547 A1      8/2019    Tawara et al.
2025/0056856 A1      2/2025    Kaji et al.

FOREIGN PATENT DOCUMENTS

JP      2020-191385 A      11/2020
JP      2020-191386 A      11/2020
WO      WO-2023119755 A1 *  6/2023   ........... H10D 30/668

OTHER PUBLICATIONS

Machine Translation of WO 2023/119755 (Year: 2023).*

(Continued)

*Primary Examiner* — Anthony Ho
(74) *Attorney, Agent, or Firm* — Posz Law Group, PLC

(57)          ABSTRACT

A silicon carbide wafer includes a substrate made of silicon carbide and an epitaxial layer made of silicon carbide and disposed on the substrate. A concentration of carbon vacancies in the substrate and the epitaxial layer continuously decreases from the substrate toward the epitaxial layer. The concentration of the carbon vacancies in the substrate is $3.0 \times 10^{15}$ cm$^{-3}$ or more.

9 Claims, 13 Drawing Sheets

(56)         References Cited

OTHER PUBLICATIONS

Skowronski, M. et al., "Degradation of Hexagonal Silicon-Carbide-Based Bipolar Devices," Journal of Applied Physics 99, 011101 (2006), pp. 1-25.

Kimoto, T. et al., "Understanding and Reduction of Degradation Phenomena in SiC Power Devices," 2017 IEEE International Reliability Physics Symposium (Monterey, CA, 2017), 2A-1, pp. 1-7.

Kawahara, Koutarou et al., "Impact of Embedding Schottky Barrier Diodes into 3.3 kV and 6.5 kV SiC MOSFETs," Materials Science Forum, 2018, vol. 924, pp. 663-666.

Hayashi, Syohei et al.,"Analysis of Stacking Fault Expansion Origin in Forward Current Degradation of 4H—SiC PiN Diodes," Proceedings of the 4th Meeting on Advanced Power Semiconductors, Nov. 1, 2017, pp. 21-22 (and partial English translation).

* cited by examiner

SILICON CARBIDE WAFER AND SILICON CARBIDE SEMICONDUCTOR DEVICE INCLUDING THE SAME

CROSS REFERENCE TO RELATED APPLICATION

The present application claims the benefit of priority from Japanese Patent Application No. 2022-168533 filed on Oct. 20, 2022. The entire disclosure of the above application is incorporated herein by reference.

TECHNICAL FIELD

The present disclosure relates to a silicon carbide (SiC) wafer and a SiC semiconductor device including the SiC wafer.

BACKGROUND

Conventionally, a SiC semiconductor device made of SiC has been proposed. For example, a SiC semiconductor device including a metal oxide semiconductor field effect transistor (MOSFET) has been proposed.

SUMMARY

The present disclosure provides a SiC wafer including a substrate made of SiC and an epitaxial layer made of SiC and disposed on the substrate. A concentration of carbon vacancies in the substrate and the epitaxial layer continuously decreases from the substrate toward the epitaxial layer. The concentration of the carbon vacancies in the substrate is $3.0 \times 10^{15}$ cm$^{-3}$ or more. The present disclosure also provides a SiC semiconductor device including the SiC wafer.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
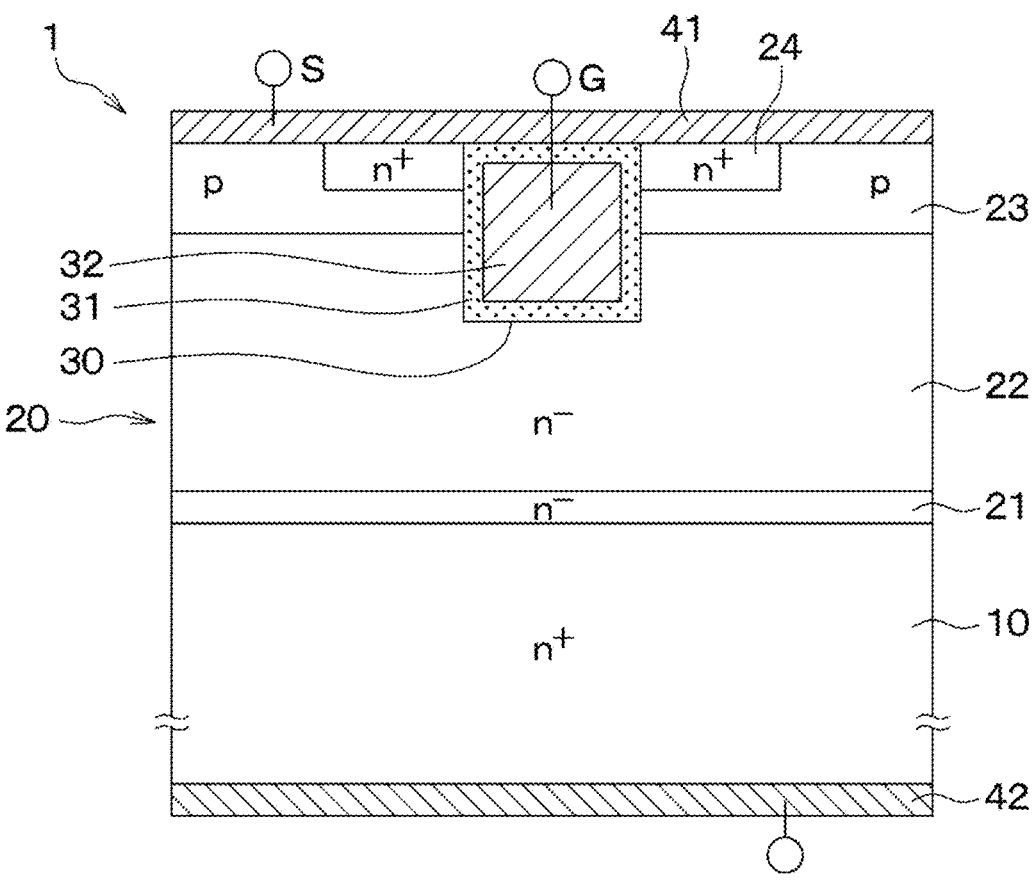
FIG. 1 is a cross-sectional view of a SiC semiconductor device according to a first embodiment.

Next, a relevant technology is described only for understanding the following embodiments. A SiC semiconductor device according to the relevant technology includes a substrate of n$^+$-type, a buffer layer of n$^-$-type having a lower impurity concentration than the substrate and disposed on the substrate, and a drift layer of n$^-$-type having a lower impurity concentration than the buffer layer and disposed on the buffer layer. On the drift layer, a base layer of p-type is disposed. The buffer layer and the drift layer are formed of epitaxial layers.

In a surface layer portion of the base layer, a source region of n$^+$-type is disposed. A plurality of trenches is provided to penetrate the source region and the base layer and reach the drift layer, and a gate insulating film and a gate electrode are sequentially disposed in each of the trenches. Accordingly, a trench gate structure is formed.

In the SiC semiconductor device as described above, a parasitic diode is formed by a pn junction between the base layer or the like and the drift layer.

Incidentally, in the SiC semiconductor device as described above, the substrate may include a basal plane dislocation. In the SiC semiconductor device as described above, holes that are injected when the parasitic diode operates may reach the basal plane dislocation, and the basal plane dislocation may expand to a stacking fault (SF).

In the SiC semiconductor device as described above, an influence of the basal plane dislocation on an element operation is small because the basal plane dislocation is a linear defect, but an influence of the stacking fault on the element operation is large because the stacking fault is a planar defect and becomes a resistance component. Therefore, in the SiC semiconductor device as described above, there is a possibility that an ON voltage becomes high.

A SiC wafer according to a first aspect of the present disclosure includes a substrate made of SiC, and an epitaxial layer made of SiC and disposed on the substrate. A concentration of carbon vacancies in the substrate and the epitaxial layer continuously decreases from the substrate toward the epitaxial layer. The concentration of the carbon vacancies in the substrate is $3.0 \times 10^{15}$ cm$^{-3}$ or more.

According to the above configuration, when a MOSFET or the like is formed using the SiC wafer, it is possible to restrict an expansion of a basal plane dislocation into a stacking fault due to the carbon vacancies.

A SiC semiconductor according to a second aspect of the present disclosure includes a SiC wafer including a substrate, an epitaxial layer, and a source region. The substrate is made of SiC and has a first conductivity type. The epitaxial layer is made of SiC and is disposed on the substrate. The epitaxial layer includes a drift layer and a base layer. The drift layer has the first conductivity type and is disposed close to the substrate. The base layer is disposed on the drift layer. The source region has the first conductivity type and is disposed in a surface layer portion of the base layer. A concentration of carbon vacancies in the substrate and the epitaxial layer continuously decreases from the substrate toward the epitaxial layer. The concentration of the carbon vacancies in the substrate is $3.0 \times 10^{15}$ cm$^{-3}$ or more.

A SiC semiconductor device according to a third aspect of the present disclosure includes a SiC wafer including a substrate and an epitaxial layer. The substrate is made of SiC and has a first conductivity type. The epitaxial layer is made of SiC and is disposed on the substrate. The substrate constitutes a part of a diode. A concentration of carbon vacancies in the substrate and the epitaxial layer continuously decreases from the substrate toward the epitaxial layer. The concentration of the carbon vacancies in the substrate is $3.0 \times 10^{15}$ cm$^{-3}$ or more.

As described above, when the SiC semiconductor device includes the SiC wafer described above, it is possible to obtain the SiC semiconductor device in which an expansion of a basal plane dislocation into a stacking fault is restricted.

First Embodiment

The following describes a first embodiment with reference to the drawings. In the present embodiment, a SiC semiconductor device including a MOSFET will be described as an example.

Although not particularly illustrated, the SiC semiconductor device includes a cell region and an outer peripheral region formed to surround the cell region. The MOSFET shown in FIG. 1 is formed in the cell region of the SiC semiconductor device.

The SiC semiconductor device is configured using a substrate 10 made of SiC and having n$^+$-type. On a surface of the substrate 10, an epitaxial layer 20 made of SiC is disposed. The epitaxial layer 20 of the present embodiment has a configuration in which a buffer layer 21 of n$^-$-type, a drift layer 22 of n$^-$-type, and a base layer 23 of p-type are stacked in this order. In the present embodiment, a SiC wafer 1 includes the substrate 10 and the epitaxial layer 20. When a length along the normal direction to a surface direction of the substrate 10 is taken as a film thickness, the epitaxial layer 20 of the present embodiment has a film thickness of about 4 to 40 μm.

In a surface layer portion of the base layer 23, a source region 24 of n$^+$-type is disposed. Note that the source region 24 is formed by performing ion implantation on the surface layer portion of the base layer 23 or forming a groove in the base layer 23 and disposing an epitaxial layer of n-type in the groove.

As the substrate 10, for example, a substrate having a specific resistance of 1 mΩ·cm or more and 30 mΩ·cm or less (for example, 20 mΩ·cm), having a front surface of a (0001) Si plane, and having an off angle of 0.5 to 5° with respect to the (0001) Si plane is used. In addition, in the substrate 10, a lifetime T of minority carriers is set to 2.5 ns or less by regulating a concentration of carbon vacancies as described later. The buffer layer 21 has, for example, an n-type impurity concentration of $1.0 \times 10^{18}$ to $1.0 \times 10^{19}$ cm$^{-3}$. The drift layer 22 has an n-type impurity concentration of, for example, $1.0 \times 10^{15}$ to $5.0 \times 10^{16}$ cm$^{-3}$. In the present embodiment, the substrate 10 constitutes a drain layer of the MOSFET.

The base layer 23 is a portion where a channel region is formed, and has, for example, a p-type impurity concentration of about $3.0 \times 10^{17}$ cm$^{-3}$ and a thickness of 0.5 to 2 μm. The source region 24 has a higher impurity concentration than the drift layer 22. For example, an n-type impurity concentration in a surface layer portion of the source region 24 is about $2.5 \times 10^{11}$ to $1.0 \times 10^{19}$ cm$^{-3}$, and the source region 24 has a thickness of 0.5 to 2 μm. Note that the film thicknesses and the like of the drift layer 22, the base layer 23, and the source region 24 may be set to any values and are not limited to the above examples.

A trench 30 is formed so as to penetrate the base layer 23 and the source region 24 and reach the drift layer 22. The base layer 23 and the source region 24 are disposed so as to be in contact with a side surface of the trench 30. Although only one trench 30 is illustrated in FIG. 1, the trench 30 is actually formed in a stripe shape in which multiple trenches are arranged at equal intervals in a left-right direction on a paper surface of FIG. 1.

A gate insulating film 31 is formed on a wall surface of the trench 30. A gate electrode 32 made of doped polysilicon is formed on a surface of the gate insulating film 31. The trench 30 is filled with the gate insulating film 31 and the gate electrode 32. In the present embodiment, a trench gate structure is configured in this manner.

Above the epitaxial layer 20, an upper electrode 41 serving as a source electrode is disposed. The upper electrode 41 is insulated from the gate electrode 32 and connected to the base layer 23 and the source region 24. In the present embodiment, the upper electrode 41 is made of multiple metals such as Ni and Al. A portion of the multiple metals that is in contact with a portion forming an n-type SiC (that is, the source region 24) is made of a metal capable of making ohmic contact with the n-type SiC. In addition, at least a portion of the multiple metals that is in contact with a portion forming a p-type SiC (that is, the base layer 23) is made of a metal capable of making ohmic contact with the p-type SiC.

A lower electrode 42 serving as a drain electrode electrically connected to the substrate 10 is formed on a rear surface of the substrate 10. In the present embodiment, with such a structure, the MOSFET of an n-channel type inverted trench gate structure is formed. The cell region is formed by arranging the multiple MOSFETs.

The basic structure of the semiconductor device according to the present embodiment is described above. Although not particularly illustrated, the substrate 10 may include a basal plane dislocation. In the SiC semiconductor device in which the MOSFET as described above is formed, holes that are injected when a parasitic diode operates reach the basal plane dislocation, so that the basal plane dislocation may expand to a stacking fault.

It has been reported that the substrate 10 made of SiC includes carbon vacancies which are intrinsic defects, and the carbon vacancies form a defect level of $Z_{1/2}$ which becomes a minority carrier killer in the forbidden band. It has also been reported that the concentration of carbon vacancies $V_C$ and the $Z_{1/2}$ concentration have a relationship of approximately 1:1. Therefore, the present inventors have intensively studied the influence of carbon vacancies.

First, the present inventors conducted intensive studies and found that carbon vacancies contained in the substrate 10 diffuse into the epitaxial layer 20 by heating. Therefore, the SiC semiconductor device of the present embodiment is manufactured as follows.

Figure 2A:
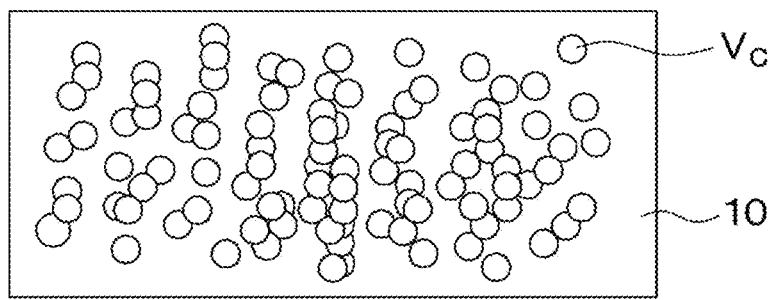
FIG. 2A is a cross-sectional view showing a manufacturing process of the SiC semiconductor device.

First, as shown in FIG. 2A, the substrate 10 is prepared. The substrate 10 is prepared by cutting a SiC ingot including carbon vacancies $V_C$. Since the SiC ingot is generally manufactured at a high temperature of 2000° C. or higher, the substrate 10 includes the carbon vacancies $V_C$. Although not particularly illustrated, the substrate 10 may also include a basal plane dislocation.

Figure 2B:
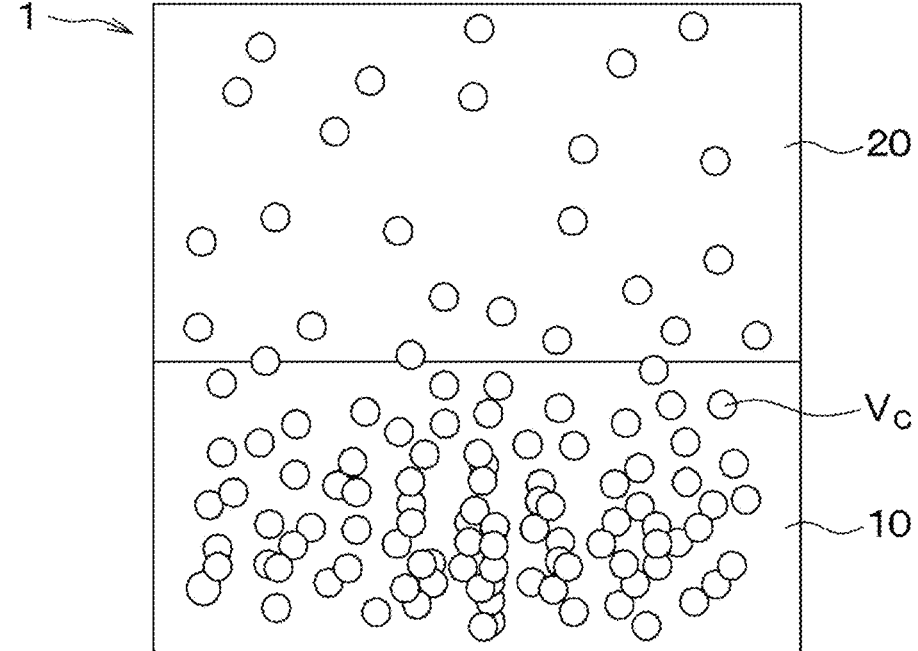
FIG. 2B is a cross-sectional view showing a manufacturing process of the SiC semiconductor device subsequent to the manufacturing process shown in FIG. 2A.

Next, as shown in FIG. 2B, the SiC wafer 1 is formed by growing the epitaxial layer 20 on the substrate 10 at about 1600 to 1700° C. At this time, since the epitaxial layer 20 is grown at about 1600 to 1700° C., the carbon vacancies $V_C$ included in the substrate 10 are diffused into the epitaxial layer 20.

Figure 2C:
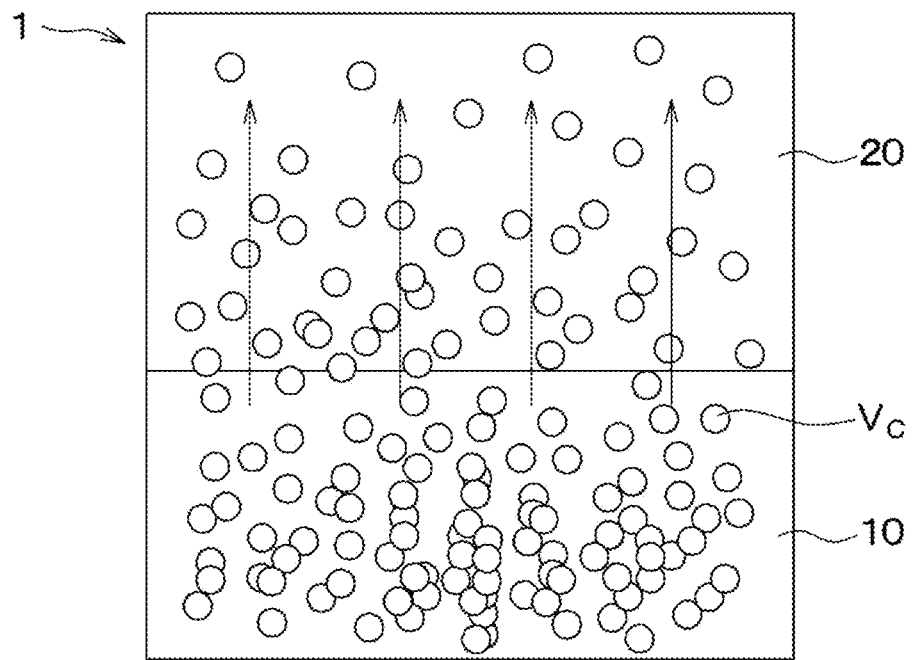
FIG. 2C is a cross-sectional view showing a manufacturing process of the SiC semiconductor device subsequent to the manufacturing process shown in FIG. 2B.
Figure 3:
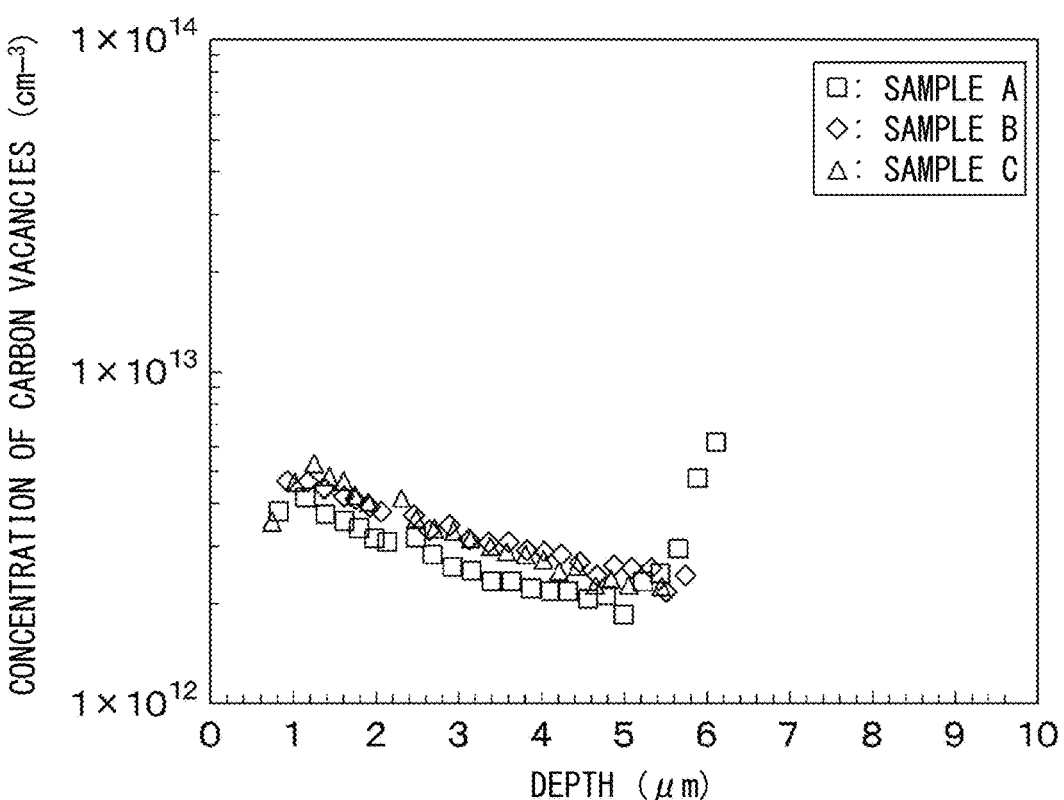
FIG. 3 is a graph showing the relationship between depths and concentrations of carbon vacancies in an epitaxial layer before heat treatment.
Figure 4:
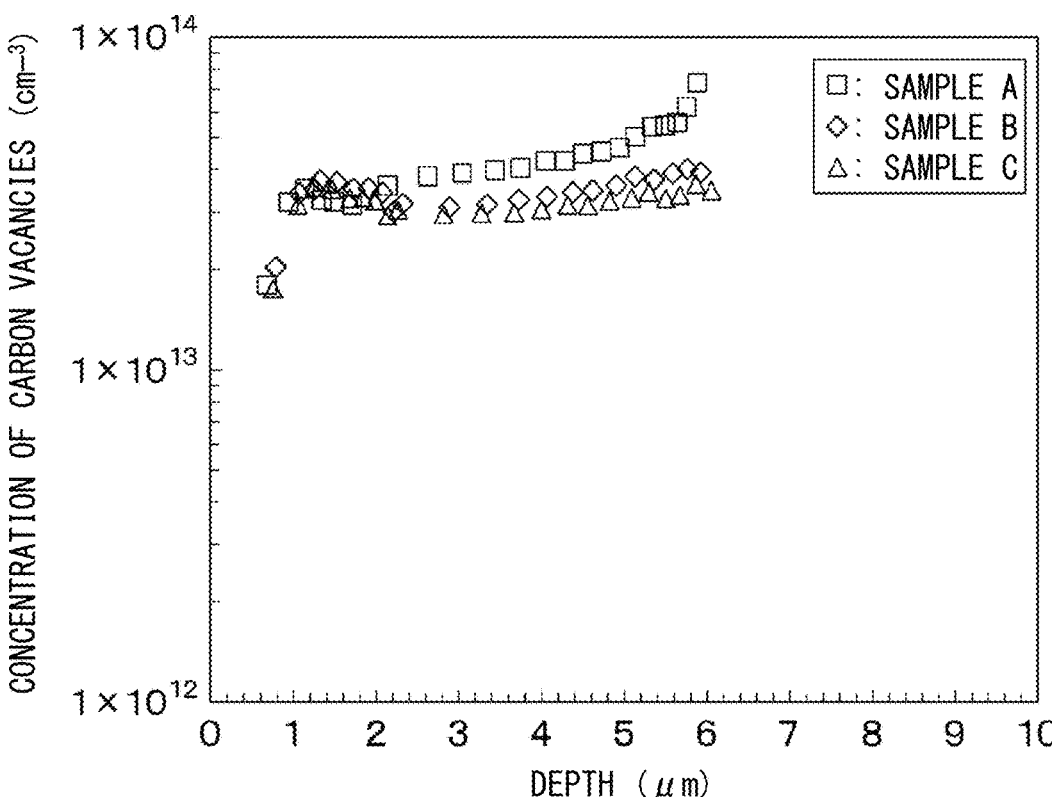
FIG. 4 is a graph showing the relationship between the depth and the concentration of carbon vacancies in the epitaxial layer after heat treatment.

Thereafter, as shown in FIG. 2C, heat treatment is performed at a temperature higher than the temperature at which the epitaxial layer 20 is grown, and the carbon vacancies $V_C$ included in the substrate 10 are further diffused toward the epitaxial layer 20. Specifically, by performing the heat treatment, as shown in FIG. 3 and FIG. 4, the concentration of the carbon vacancies $V_C$ included in the epitaxial layer 20 can be increased. FIGS. 3 and 4 show the results obtained when the epitaxial layer 20 having a thickness of 9 μm is grown on the substrate 10, and a surface of the epitaxial layer 20 (that is, a surface of the epitaxial layer 20 on a side opposite to the substrate 10) is set to 0 μm. That is, FIG. 3 and FIG. 4 show the concentrations of carbon vacancies $V_C$ in the epitaxial layer 20 of Samples A to C. In FIG. 3 and FIG. 4, Samples A to C are different from each other in venders of the substrate 10. FIG. 3 and FIG. 4 are based on the results of measuring the distribution of the $Z_{1/2}$ concentration by a deep level transient spectroscopy (DLTS) method. Since the $Z_{1/2}$ concentration and the concentration of the carbon vacancies $V_C$ are substantially equal to each other, the results of measuring the carbon vacancies $V_C$ are obtained. The concentration of carbon vacancies $V_C$, which will be described later, is also confirmed by the DLTS method. Furthermore, when the heat treatment is performed, the heat treatment may be performed in a state in which a carbon cap is disposed in order to restrict surface roughness.

Note that the base layer 23 and the source region 24 are configured by appropriately performing ion implantation on the epitaxial layer 20, but the base layer 23 and the source region 24 may be formed before the heat treatment or may be formed after the heat treatment. The temperature at which the heat treatment is performed is higher than the temperature at which the epitaxial layer 20 is grown and lower than a sublimation temperature of SiC.

Figure 5:
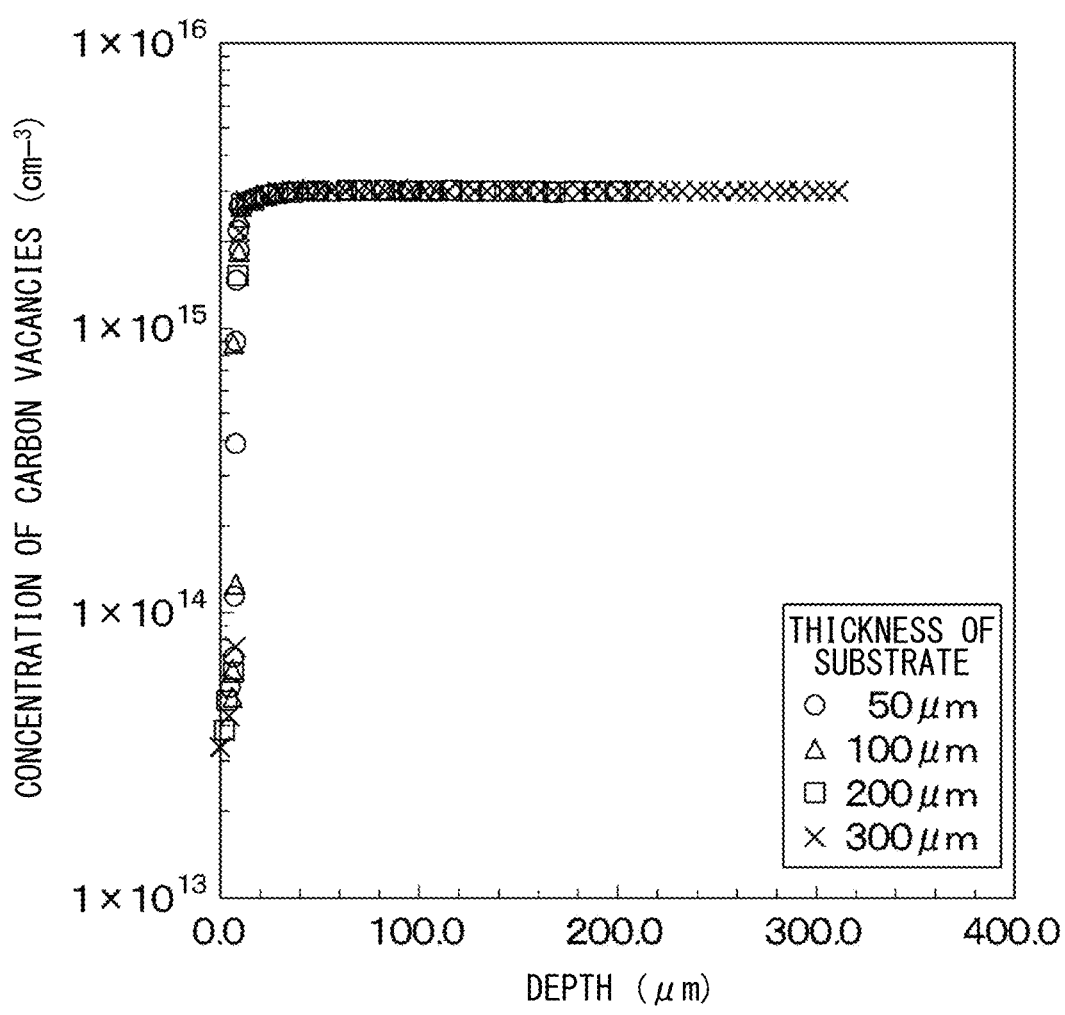
FIG. 5 is a graph showing the relationship between the depth and the concentration of carbon vacancies in an epitaxial layer and a substrate after heat treatment.
Figure 6:
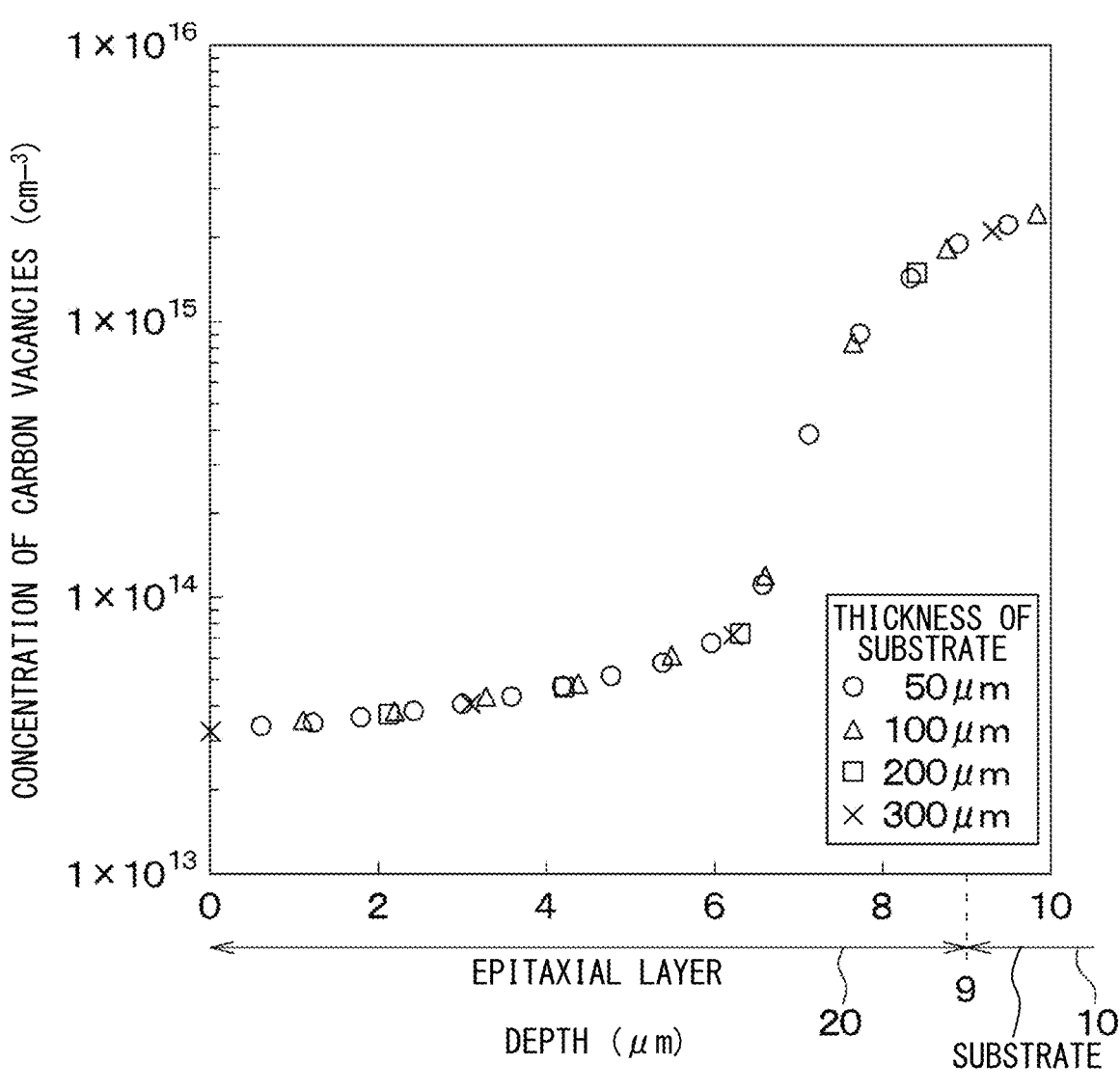
FIG. 6 is a graph showing the relationship between the depth and the concentration of carbon vacancies in the epitaxial layer and the substrate after heat treatment.

By diffusing the carbon vacancies $V_C$ in this manner, as shown in FIG. 5 and FIG. 6, the carbon vacancies $V_C$ have a concentration distribution that continuously decreases from the substrate 10 toward the epitaxial layer 20. FIG. 5 and FIG. 6 show results of samples in which the epitaxial layer 20 having a thickness of 9 μm is formed on each of the substrates 10 having a thickness of 50 μm, 100 μm, 200 μm, or 300 μm and the heat treatment is performed. As shown in FIG. 5 and FIG. 6, it is confirmed that the concentration of the carbon vacancies $V_C$ in the epitaxial layer 20 does not depend on the thickness of the substrate 10.

Figure 7:
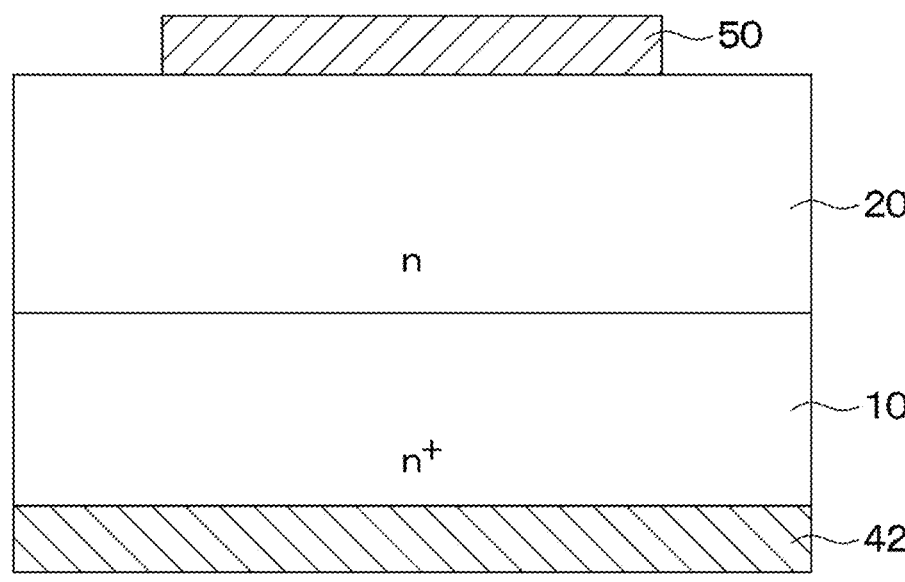
FIG. 7 is a schematic diagram of a SiC semiconductor device used in a simulation.

FIG. 7 is a schematic diagram of a SiC semiconductor device including a Schottky diode in which the epitaxial layer 20 having an n-type impurity concentration of $1.0 \times 10^{15}$ cm$^{-3}$ is disposed on the substrate 10, a Schottky electrode 50 is disposed on the epitaxial layer 20, and the lower electrode 42 is disposed on the substrate 10. Note that, in order to obtain the results shown in FIG. 4 after the MOSFET is produced, the same evaluation can be performed for the parasitic diode of the MOSFET.

Figure 8:
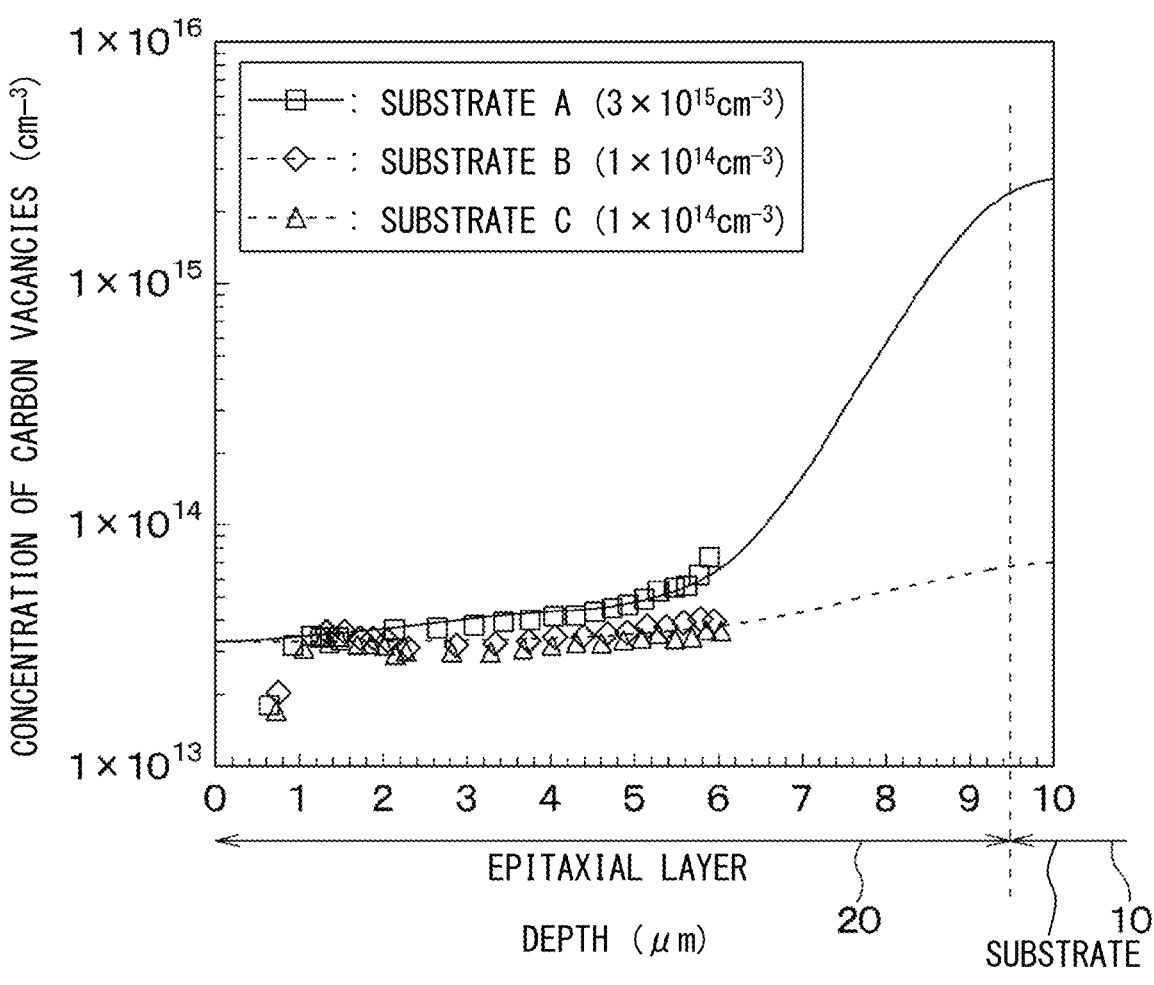
FIG. 8 is a graph showing the relationship between the depth and the concentration of carbon vacancies after heat treatment.

FIG. 8 is a graph showing the relationship between the depth and the concentration of carbon vacancies $V_C$ in the epitaxial layer 20 formed on each of a substrate A, a substrate B, and a substrate C as the substrate 10 having different concentrations of the carbon vacancies $V_C$ and subjected to the heat treatment. The concentration of carbon vacancies $V_C$ in the substrate A is $3.0 \times 10^{15}$ cm$^{-3}$, the concentration of carbon vacancies $V_C$ in the substrate B is $1.0 \times 10^{14}$ cm$^{-3}$, and the concentration of carbon vacancies $V_C$ in the substrate C is $1.0 \times 10^{14}$ cm$^{-3}$. As shown in FIG. 8, it is confirmed that the concentration of the carbon vacancies $V_C$ in the epitaxial layer 20 increases with increase in the concentration of the carbon vacancies $V_C$ in the substrate 10.

Figure 9:
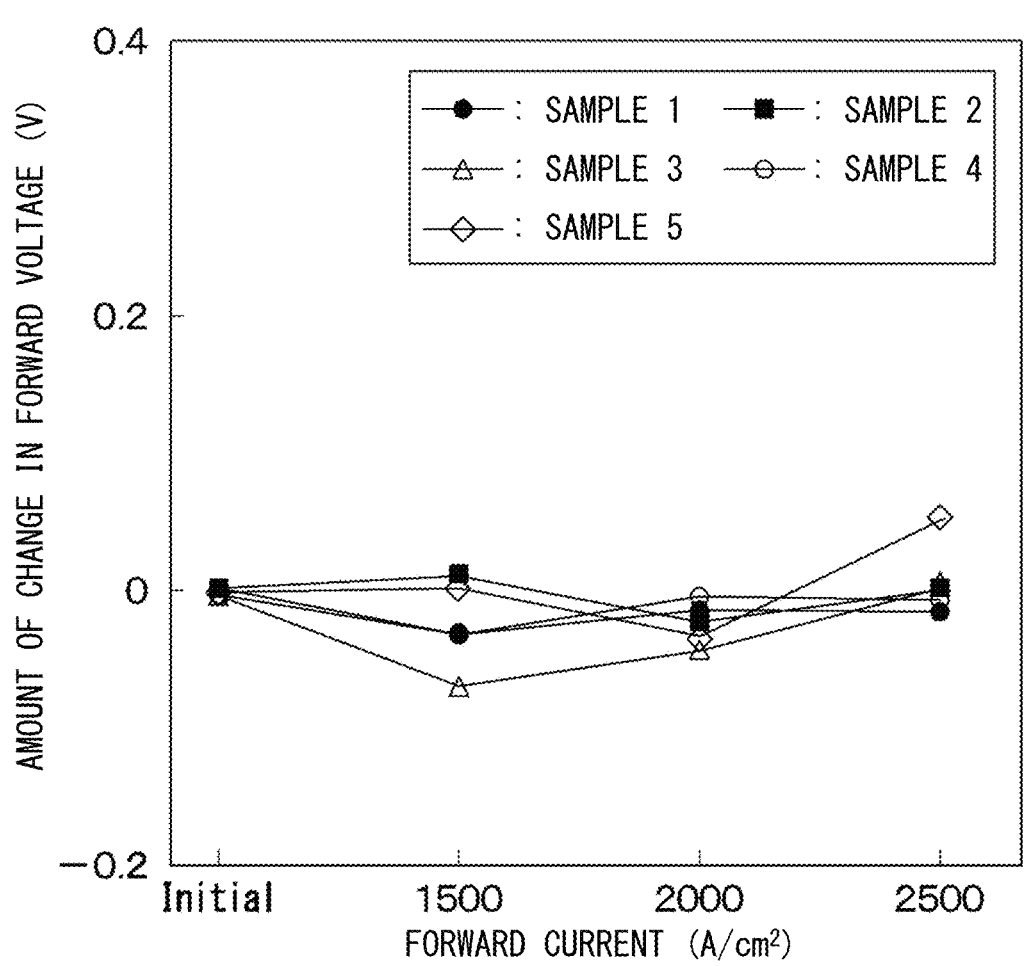
FIG. 9 is a graph showing the relationship between the forward current and the amount of change in the forward voltage in a case where the concentration of carbon vacancies in the substrate is $3.0 \times 10^{15}$ cm$^{-3}$.
Figure 10:
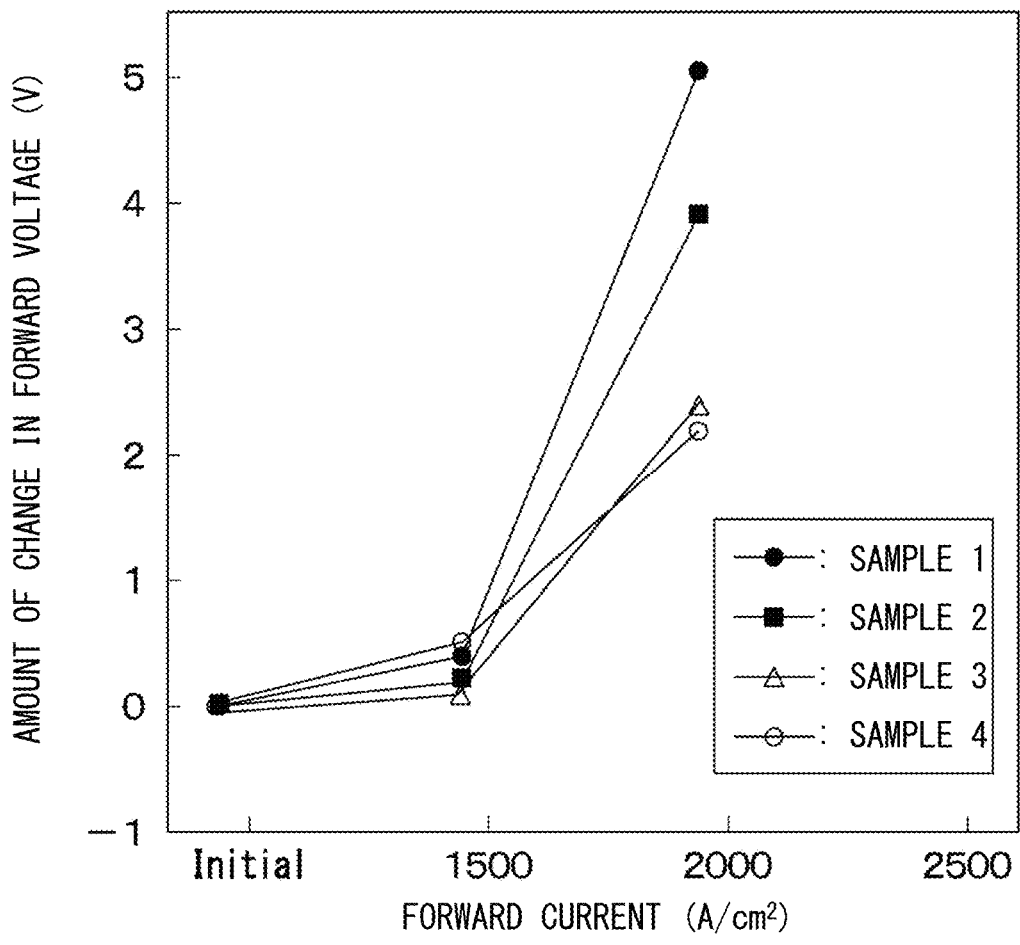
FIG. 10 is a graph showing the relationship between the forward current and the amount of change in the forward voltage in a case where the concentration of carbon vacancies in the substrate is $1.0 \times 10^{14}$ cm$^{-3}$.

The inventors of the present invention further intensively studied the relationship between the concentration of carbon vacancies $V_C$ and a forward current, and obtained the results shown in FIG. 9 and FIG. 10. FIG. 9 and FIG. 10 show results obtained in configurations in which pn diodes are configured by changing the epitaxial layer 20 in FIG. 7 to p-type and changing the Schottky electrode 50 to the upper electrode 41. FIG. 9 shows the amounts of change in forward voltages of five pn diodes (Samples 1 to 5) formed using the substrate 10 in which the concentration of carbon vacancies $V_C$ is $3.0 \times 10^{15}$ cm$^{-3}$, and FIG. 10 shows the amounts of change in forward voltages of four pn diodes (Samples 1 to 4) formed using the substrate 10 in which the concentration of carbon vacancies $V_C$ is $1.0 \times 10^{14}$ cm$^{-3}$. In FIG. 9 and FIG. 10, the forward voltage when the forward current is 40 A is set as a reference value (that is, "Initial" in the drawings), and the amounts of change with respect to the reference value are set as the amounts of change in the forward voltages.

As shown in FIG. 9, when the concentration of the carbon vacancies $V_C$ in the substrate 10 is $3.0 \times 10^{15}$ cm$^{-3}$, it is confirmed that the amounts of change in the forward voltages are small even when the forward current is increased. On the other hand, as shown in FIG. 10, when the concentration of the carbon vacancies $V_C$ in the substrate 10 is $1.0 \times 10^{14}$ cm$^{-3}$, it is confirmed that the amounts of change in the forward voltages increase with increase in the forward current.

Figure 11:
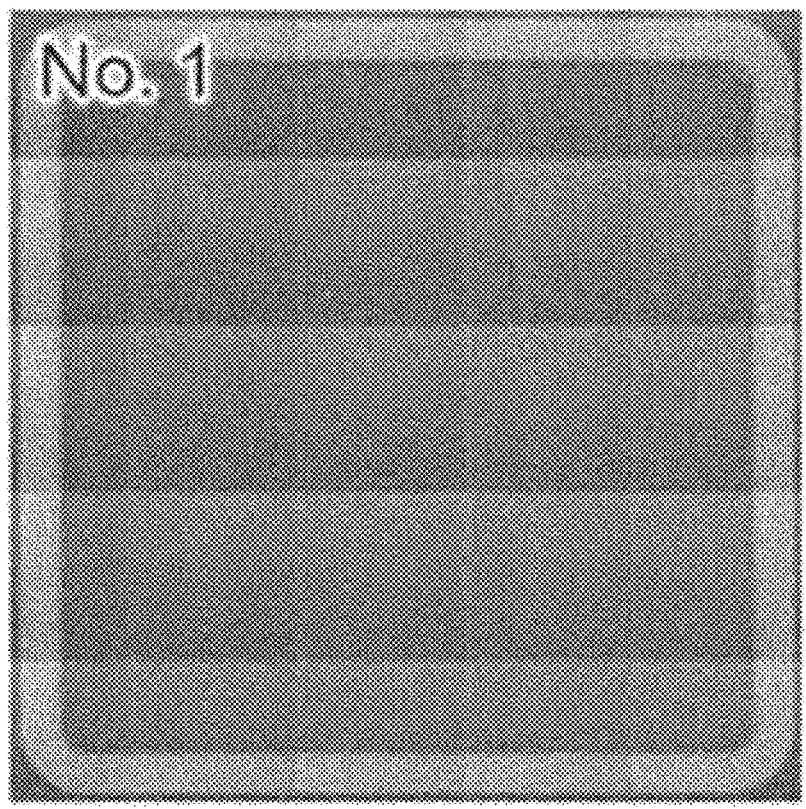
FIG. 11 is a photoluminescence image in a case where the concentration of carbon vacancies in the substrate is $3.0 \times 10^{15}$ cm$^{-3}$, in which fluorescence of $420 \pm 10$ nm is captured by an optical filter.
Figure 12:
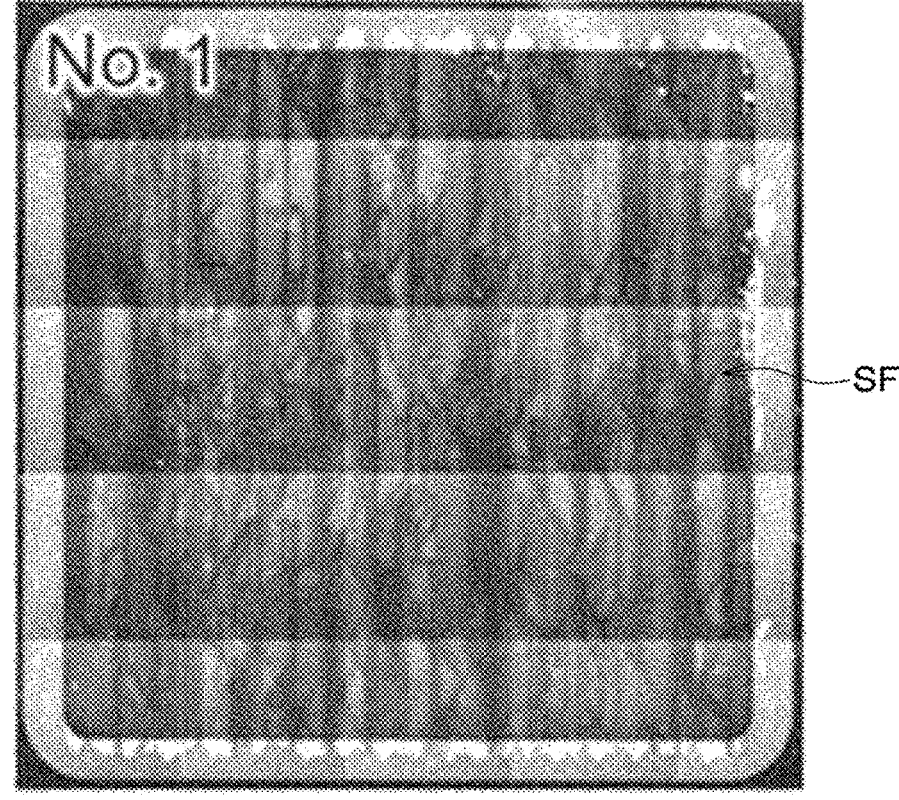
FIG. 12 is a photoluminescence image in a case where the concentration of carbon vacancies in the substrate is $1.0 \times 10^{14}$ cm$^{-3}$, in which fluorescence of $420 \pm 10$ nm is captured by an optical filter.

Then, the present inventors obtained a photoluminescence (hereinafter, also simply referred to as PL) image of the above described semiconductor device after applying a forward current, and obtained the results shown in FIG. 11 and FIG. 12. FIG. 11 and FIG. 12 are PL images in which only light having a wavelength of 420±10 nm is projected onto a detector using an optical filter. FIG. 11 is an image after the forward current is applied up to 2500 A/cm$^2$. FIG. 12 is an image after the forward current is applied up to 2000 A/cm$^2$.

As shown in FIG. 11, when the concentration of the carbon vacancies $V_C$ in the substrate 10 is $3.0 \times 10^{15}$ cm$^{-3}$, defects such as SF are not confirmed even after the forward current is applied. On the other hand, as shown in FIG. 12, when the concentration of carbon vacancies $V_C$ in the substrate 10 is $1.0 \times 10^{14}$ cm$^{-3}$, it is confirmed that a plurality of SFs is generated.

Therefore, in the present embodiment, the concentration of the carbon vacancies $V_C$ in the substrate 10 is set to $3.0\times10^{15}$ cm$^{-3}$ or more. Specifically, the substrate 10 is obtained by cutting a SiC ingot, and the SiC ingot includes the carbon vacancies $V_C$. The SiC ingot is obtained by a high temperature chemical vapor deposition (CVD) method, and the concentration of the carbon vacancies $V_C$ changes depending on the temperature at the time of producing the SiC ingot. Specifically, the concentration of the carbon vacancies $V_C$ increases with increase in the temperature at the time of producing the SiC ingot. Therefore, in the present embodiment, the substrate 10 is formed by a high-temperature CVD method under a condition of about 2500° C. or more so as to include the carbon vacancies $V_C$ of $3.0\times10^{15}$ cm$^{-3}$ or more after the heat treatment. That is, it can be said that the substrate 10 of the present embodiment is a substrate containing high carbon vacancies in which the concentration of the carbon vacancies $V_C$ is $3.0\times10^{15}$ cm$^{-3}$ or more after the heat treatment. In a case where the concentration of the carbon vacancies $V_C$ approaches the impurity concentration (donor concentration) too close or exceeds the impurity concentration, the resistance increases, and the device characteristics may deteriorate. Therefore, the concentration of the carbon vacancies $V_C$ in the substrate 10 is preferably $3.0\times10^{15}$ cm$^{-3}$ or more and $1.0\times10^{16}$ cm$^{-3}$ or less.

According to the present embodiment described above, the substrate 10 includes the carbon vacancies $V_C$ of $3.0\times10^{15}$ cm$^{-3}$ or more, and the concentration of the carbon vacancies $V_C$ gradually decreases from the substrate 10 toward the epitaxial layer 20. Therefore, it is possible to make it difficult for the basal plane dislocation to expand the stacking fault. Therefore, for example, when a MOSFET is formed, it is possible to restrict an increase in the ON voltage.

Second Embodiment

The following describes a second embodiment. The present embodiment is different from the first embodiment in that an impurity is added to the substrate 10. The other configurations of the present embodiment are similar to those of the first embodiment, and therefore a description of the similar configurations will not be repeated.

In the present embodiment, the substrate 10 contains at least one impurity selected from a group consisting of boron (B), aluminum (Al), titanium (Ti), vanadium (V), sulfur (S), iron (Fe), niobium (Nb), and tantalum (Ta). According to this configuration, since the impurity element also functions as a minority carrier killer, it is possible to further restrict the extension of the basal plane dislocation to the stacking fault.

Figure 13:
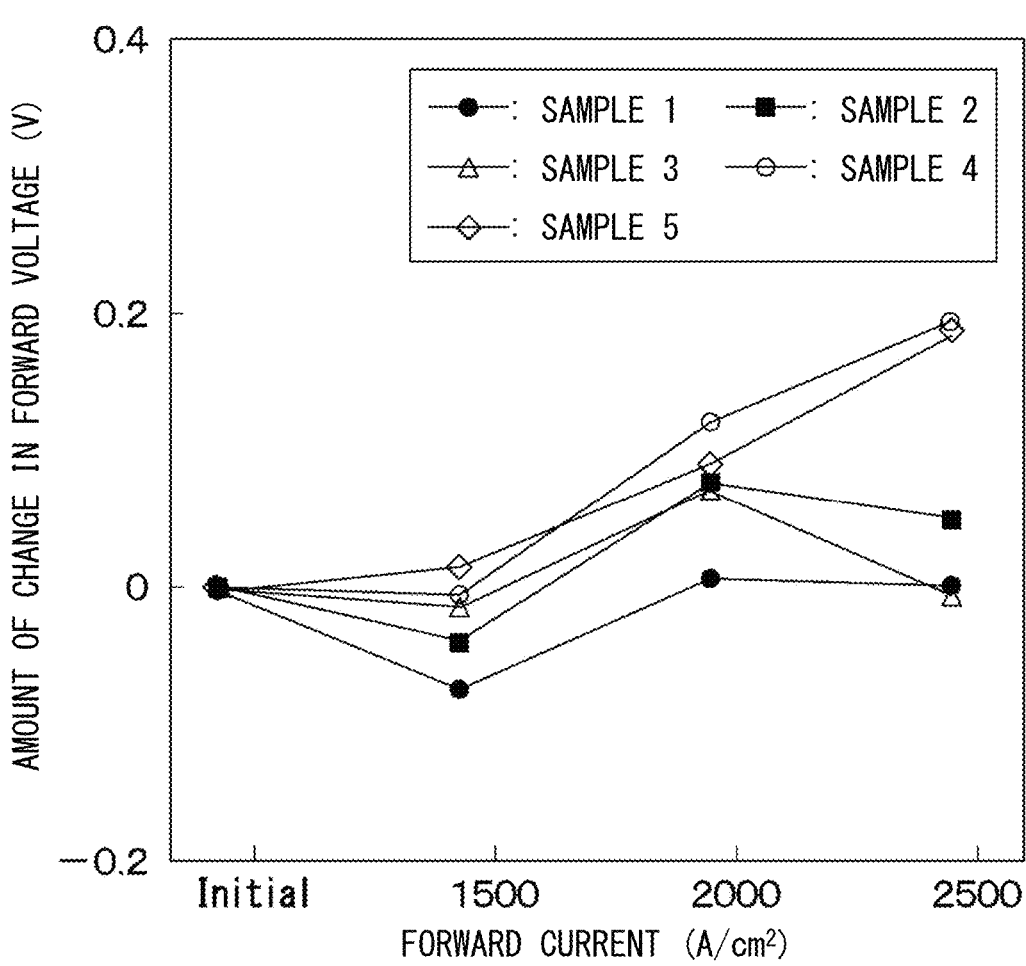
FIG. 13 is a graph showing the relationship between the forward current and the amount of change in the forward voltage in a case where the concentration of carbon vacancies in the substrate is $1.0 \times 10^{14}$ cm$^{-3}$.
Figure 14:
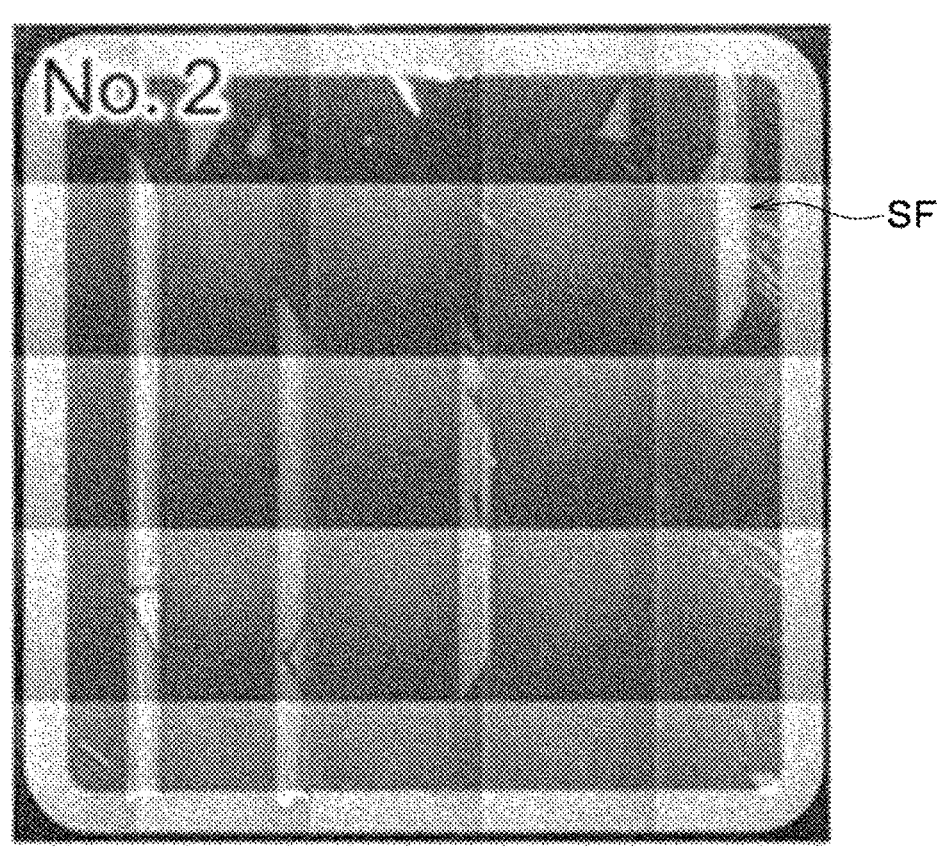
FIG. 14 is a photoluminescence image in the case where the concentration of carbon vacancies in the substrate is $1.0 \times 10^{14}$ cm$^{-3}$ in the second embodiment, in which fluorescence of $420 \pm 10$ nm is captured by an optical filter.

FIG. 13 shows the amounts of change in forward voltages of five pn diodes (Samples 1 to 5) formed using the substrate 10 in which the concentration of the carbon vacancies $V_C$ is $1.0\times10^{14}$ cm$^{-3}$ and boron is contained at a concentration of $1.0\times10^{16}$ cm$^{-3}$. As compared with FIG. 10, it is confirmed that the concentration of the carbon vacancies $V_C$ is the same, but the amounts of change in the forward voltages are small due to inclusion of the impurity. In addition, as illustrated in FIG. 14, although stacking faults are confirmed, the number of the stacking faults is small as compared with FIG. 12. FIG. 14 is a diagram illustrating a binarized PL image after a forward current is applied up to 2500 A/cm$^2$.

According to the present embodiment described above, the substrate 10 includes the carbon vacancies $V_C$ of $3.0\times10^{15}$ cm$^{-3}$ or more, and the carbon vacancies $V_C$ gradually decreases from the substrate 10 toward the epitaxial layer 20. Therefore, the same effects as those of the first embodiment can be obtained.

OTHER EMBODIMENTS

Although the present disclosure has been described in accordance with the embodiments, it is understood that the present disclosure is not limited to such embodiments or structures. The present disclosure encompasses various modifications and variations within the scope of equivalents. In addition, various combinations and configurations, as well as other combinations and configurations that include only one element, more, or less, fall within the scope and spirit of the present disclosure.

In each of the above-described embodiments, the SiC semiconductor device including the MOSFET has been described. However, the SiC semiconductor device may include the Schottky diode as shown in FIG. 7, or may include a pn diode in which the epitaxial layer 20 of FIG. 7 is changed to a p-type layer and the Schottky electrode 50 is changed to the upper electrode 41.

In each of the above-described embodiments, the MOSFET with the n-channel type trench gate structure in which a first conductivity type is n-type and a second conductivity type is p-type has been described. However, the semiconductor device may be formed with a MOSFET with a p-channel type trench gate structure in which the conductivity type of each component is inverted with respect to the n-channel type.

What is claimed is:

1. A silicon carbide wafer comprising:
a substrate made of silicon carbide; and
an epitaxial layer made of silicon carbide and disposed on the substrate, wherein
a concentration of carbon vacancies in the substrate and the epitaxial layer continuously decreases from the substrate toward the epitaxial layer,
the concentration of the carbon vacancies in the substrate is $3.0\times10^{15}$ cm$^{-3}$ or more, and
the substrate has a specific resistance of 30 mΩ·cm or less.

2. The silicon carbide wafer according to claim 1, wherein
the substrate contains impurities including at least one element selected from a group consisting of boron, aluminum, titanium, vanadium, sulfur, iron, niobium, and tantalum.

3. The silicon carbide wafer according to claim 1, wherein
the epitaxial layer has a thickness of 4 to 40 μm and includes a portion having an impurity concentration of $1.0\times10^{15}$ to $1.0\times10^{19}$ cm$^{-3}$.

4. The silicon carbide wafer according to claim 3, wherein
the epitaxial layer includes a buffer layer disposed on the substrate and a drift layer disposed on the buffer layer,
the buffer layer has an impurity concentration of $1.0\times10^{18}$ to $1.0\times10^{19}$ cm$^{-3}$, and
the drift layer has an impurity concentration of $1.0\times10^{15}$ to $5.0\times10^{16}$ cm$^{-3}$.

5. A silicon carbide semiconductor device comprising:
a silicon carbide wafer including:
a substrate made of silicon carbide and having a first conductivity type; and
an epitaxial layer made of silicon carbide and disposed on the substrate, the epitaxial layer including a drift layer and a base layer, the drift layer having the first conductivity type and disposed close to the substrate, the base layer disposed on the drift layer; and
a source region of the first conductivity type disposed in a surface layer portion of the base layer, wherein a concentration of carbon vacancies in the substrate and the epitaxial layer continuously decreases from the substrate toward the epitaxial layer, the concentration of the carbon vacancies in the substrate is $3.0 \times 10^{15}$ cm$^{-3}$ or more, the substrate has a specific resistance of 30 mΩ·cm or less.

6. A silicon carbide semiconductor device comprising:

a silicon carbide wafer including:

a substrate made of silicon carbide and having a first conductivity type; and an epitaxial layer made of silicon carbide and disposed on the substrate, wherein the substrate constitutes a part of a diode, a concentration of carbon vacancies in the substrate and the epitaxial layer continuously decreases from the substrate toward the epitaxial layer, the concentration of the carbon vacancies in the substrate is $3.0 \times 10^{15}$ cm$^{-3}$ or more, the substrate has a specific resistance of 30 mΩ·cm or less.

7. A silicon carbide wafer comprising:

a substrate made of silicon carbide; and an epitaxial layer made of silicon carbide and disposed on the substrate, wherein a concentration of carbon vacancies in the substrate and the epitaxial layer continuously decreases from the substrate toward the epitaxial layer, the concentration of the carbon vacancies in the substrate is $3.0 \times 10^{15}$ cm$^{-3}$ or more, and the epitaxial layer has a thickness of 4 to 40 μm and includes a portion having an impurity concentration of $1.0 \times 10^{15}$ to $1.0 \times 10^{19}$ cm$^{-3}$.

8. The silicon carbide wafer according to claim 7, wherein the substrate contains impurities including at least one element selected from a group consisting of boron, aluminum, titanium, vanadium, sulfur, iron, niobium, and tantalum.

9. The silicon carbide wafer according to claim 7, wherein the epitaxial layer includes a buffer layer disposed on the substrate and a drift layer disposed on the buffer layer, the buffer layer has an impurity concentration of $1.0 \times 10^{18}$ to $1.0 \times 10^{19}$ cm$^{-3}$, and the drift layer has an impurity concentration of $1.0 \times 10^{15}$ to $5.0 \times 10^{16}$ cm$^{-3}$.

* * * * *